(12) United States Patent
Lee et al.

(10) Patent No.: US 6,774,828 B1
(45) Date of Patent: Aug. 10, 2004

(54) AUTO CORRECTION ALGORITHM FOR PIECE-WISE LINEAR CIRCUITS

(75) Inventors: Norman C. Lee, Monterey Park, CA (US); Mark V. Martin, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/761,887

(22) Filed: Jan. 20, 2004

(51) Int. Cl.[7] .................................................. H03M 1/12
(52) U.S. Cl. ........................................ 341/118; 341/120
(58) Field of Search .................................. 341/118, 120

(56) References Cited

U.S. PATENT DOCUMENTS

| | | | | |
|---|---|---|---|---|
| 3,522,599 A | * | 8/1970 | Davis | 341/138 |
| 6,642,869 B2 | * | 11/2003 | Kuyel et al. | 341/120 |
| 6,714,886 B2 | * | 3/2004 | Sung et al. | 702/107 |
| 2003/0160713 A1 | * | 8/2003 | Kuyel et al. | 341/120 |

* cited by examiner

*Primary Examiner*—Howard L. Williams
(74) *Attorney, Agent, or Firm*—Leonard A. Alkov

(57) ABSTRACT

Conversion errors of the prior art are reduced by a piece wise linear analog to digital converter. The analog to digital (A/D) converter operates between a minimum voltage and a maximum voltage and uses one or more comparators to generate one or more digital bits, each of the digital bits representative of a conversion voltage. A first voltage interval is allocated for linear analog to digital conversion. This first voltage interval extends from the minimum voltage to an intermediate voltage, where the intermediate voltage is less than the maximum voltage. A second voltage interval extends from the intermediate voltage to the maximum voltage. An error correcting band is encoded in the analog signal between the first voltage interval and the second voltage interval.

Each of the comparators used in the A/D has a sensing level. The error correcting band is centered with respect to one of the sensing levels, the sensing level located at the intermediate voltage. The error correcting band extends over a correcting voltage. The correcting voltage is a fraction of the conversion voltage.

20 Claims, 5 Drawing Sheets

AUTO CORRECTION ALGORITHM FOR PIECE-WISE LINEAR CIRCUITS

BACKGROUND OF THE INVENTION

1. Field of Invention

This invention is in the field of analog to digital encoding and auto correction for the reduction of comparator errors used therein.

2. Description of the Related Art

Signal conversion from one format to another is an essential part of today's electronic systems. For example, analog signals are typically converted from an analog format to a digital format to facilitate certain operations. This analog to digital conversion (A/D) generates a digital representation of the analog signal. The digital representation facilitates further processing of the original analog signal using digital components such as memories and processors. Using digital means of processing is desirable as it facilitates mathematical operations while avoiding the limitations inherent in an analog environment.

For effective signal processing, the A/D conversion process needs to maintain fidelity to the analog signal. That is, the digital representation of the analog signal accurately represents the original analog signal converted into digital format. The desire for fidelity in converting between analog and digital representation has created various mechanisms to avoid limitations inherent in a digital representation. For example, where analog signals have a wide dynamic range, the conversion to the digital format is allocated in amplitude intervals to allow relatively accurate representation of the analog signal using a limited number of digital bits. This method for converting wide dynamic range analog signals into digital bits assigns linear amplitude intervals for conversion along the overall analog signal amplitude. This method, referred to as piece wise linear conversion, generates a digital output for each interval. The intervals may be assigned to portions of the maximum voltage of the analog signal so that the result is a non-linear conversion to digital, typically compressing the wide dynamic range of the amplitude of the analog signal into the available number of bits of the digital format. If errors are minimized, the inverse of the non-linear transfer function can be used at a digital to analog converter to restore the wide dynamic range analog signal from its digital representation.

However, in choosing a piece wise linear conversion method errors are encountered, typically at the decoder, or receiving end. The decoder may mis-identify the location of the transitions between the different linear segments of the piece wise linear conversion intervals. This source of error introduces discontinuities between the adjoining segments of the piece wise linear function, generating errors in the reconstructed analog signal.

SUMMARY OF THE INVENTION

Conversion errors of the prior art are reduced by a piece wise linear analog to digital converter. The analog to digital converter operates between a minimum voltage and a maximum voltage and uses one or more comparators to generate one or more digital bits, each of the digital bits representative of a conversion voltage. A first voltage interval is allocated for linear analog to digital conversion. This first voltage interval extends from the minimum voltage to an intermediate voltage, where the intermediate voltage is less than the maximum voltage. A second voltage interval extends from the intermediate voltage to the maximum voltage.

An error correcting band is encoded in the analog signal between the first voltage interval and the second voltage interval.

Each of the comparators has a sensing level. The error correcting band is centered with respect to one of the sensing levels, the sensing level located at the intermediate voltage. The error correcting band extends over a correcting voltage. The correcting voltage a fraction of the conversion voltage.

DETAILED DESCRIPTION

The present invention describes a digital link and method of digitally encoding an analog signal using piece wise linear analog to digital conversion methods that avoid some of the conversion errors encountered in the prior art. An auto-correction method is described for a piece wise linear system having reduced error recovery and greater signal reproduction fidelity of the original signal.

Figure 1:
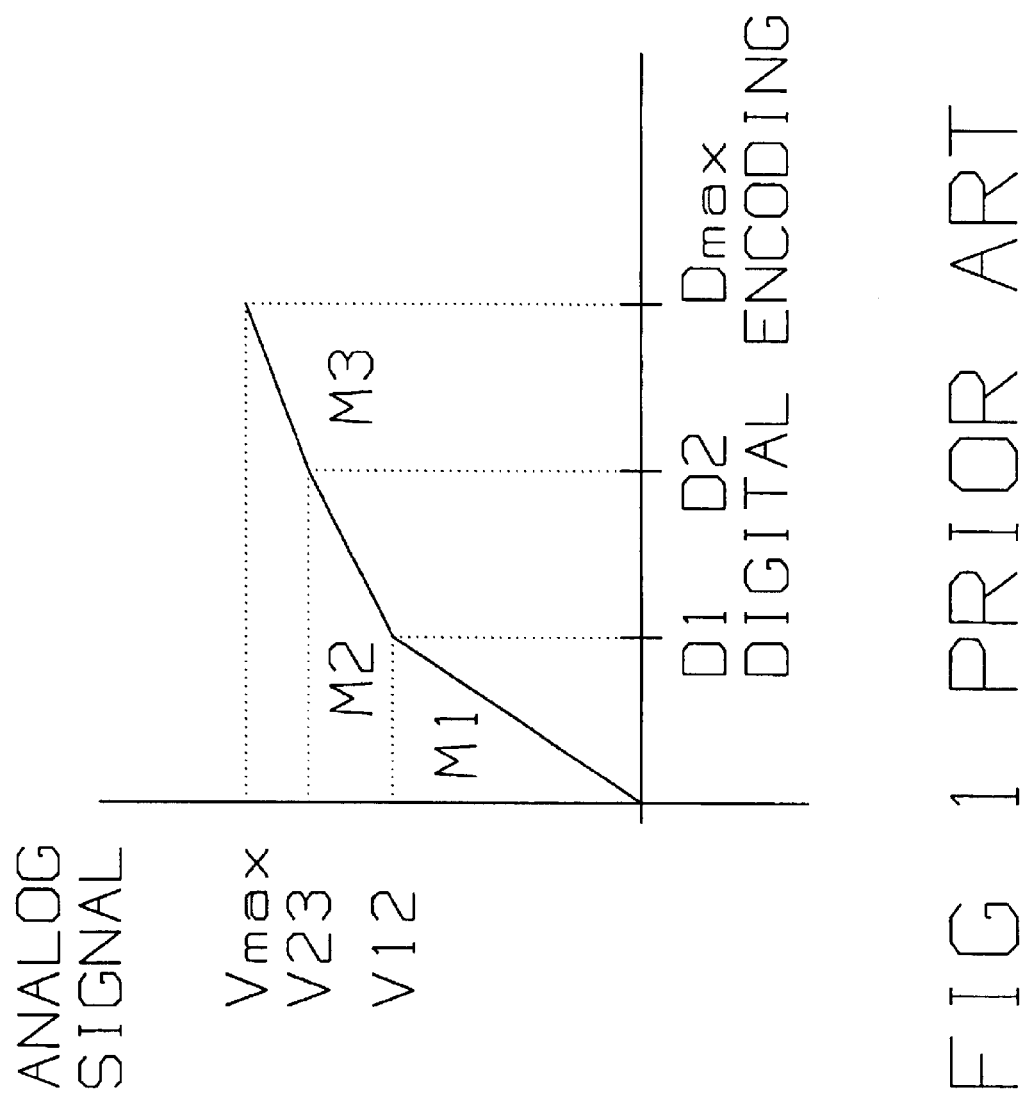
FIG. 1 is a sample configuration of the prior art showing piece wise linear conversion of an analog input into a digitally encoded output.

As shown in FIG. 1, in a traditional, ideal, piece wise linear system of the prior art, an analog input having a range from 0 volts minimum voltage to $V_{max}$ maximum is presented for conversion to digital format. The piece wise linear converter subdivides the input voltage range into several segments, for example 0 volts to V12 (interval M1), V12 to v23, (interval M2), and V23 to VMax, the highest analog voltage value expected for conversion. Each interval M1, M2 and M3 is designed with an offset and a gain to form a continuous transfer function between the analog signal and its digital encoding. When working in a theoretical ideal fashion, each voltage amplitude will correspond to a digital value, and vice versa. For example, as shown, theoretically for best fidelity, analog voltage $V_{12}$ encodes as digital value $D_1$, $V_{23}$ encodes as $D_2$, and $V_{max}$ encodes as $D_{max}$.

Conversely, when reconstructing the analog signal from its digital format, ideally the value of $D_1$ will generate an analog voltage $V_{12}$, $D_2$ will generate $V_{23}$, while a digital input $D_{max}$ will generate the maximum analog output $V_{max}$.

The ideal analog to digital encoding process is reversible. That is, the digital output of the piece wise linear encoder can be used, or decoded, to recover the original analog signal using the inverse of the piece wise linear transfer function without errors.

Unlike the ideal, theoretical conversion, the real conversion process generates errors, with loss of digital to analog reconstruction fidelity. Analog to digital (A/D) conversion and digital to analog conversion (D/A) is typically performed using comparators. During A/D conversion, the comparators compare the voltage presented to the A/D converter and generate a digital signal. The digital signal is generated by the converter from switching to a"1", if the voltage is at or above a predetermined analog level. It is the shift in this switching voltage due to temperature, age, noise and other factors that presents uncertainty as to the switching point of the comparator. Typical constructions of A/D and D/A converters and the use of comparators is detailed in documents -published by Analog Devices, Norwood, Mass.

Figure 2:
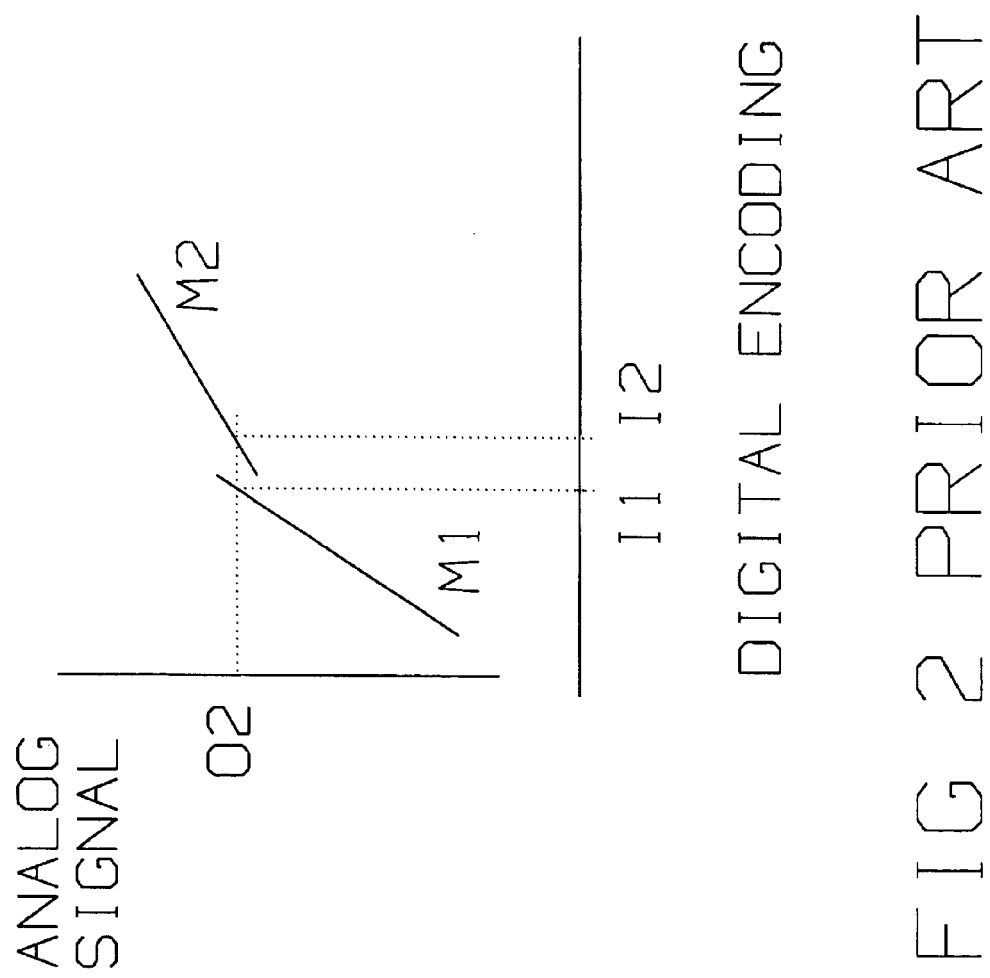
FIG. 2 shows a source of error in the piece wise linear conversion method of the prior art.

Comparators have errors in the gain and offset of the amplifiers used within. As shown in FIG. 2, because of these errors, transition points of the piece wise linear transfer function may be displaced, such as the transition from interval M1 to interval M2. The effects of an offset error can be at the comparator level. Because of comparator error(s), a D/A decoder maps $I_1$ as well as $I_2$ to O2. This produces an uncorrectable error during D/A decoding process because two different inputs $I_1$ and $I_2$ can map to the same output value O2. There are other errors in a comparator's switch point level. The switch point level (where a comparator goes from one state "1" to a "0", or "0" to "1") will tend to deviate from a nominal, specified switch point level due to manufacturing tolerances, age drift, and dynamic effects such as noise. Thus, because of these errors, the gains and offsets of a piece wise function using comparators will also vary, presenting conversion errors.

Figure 3:
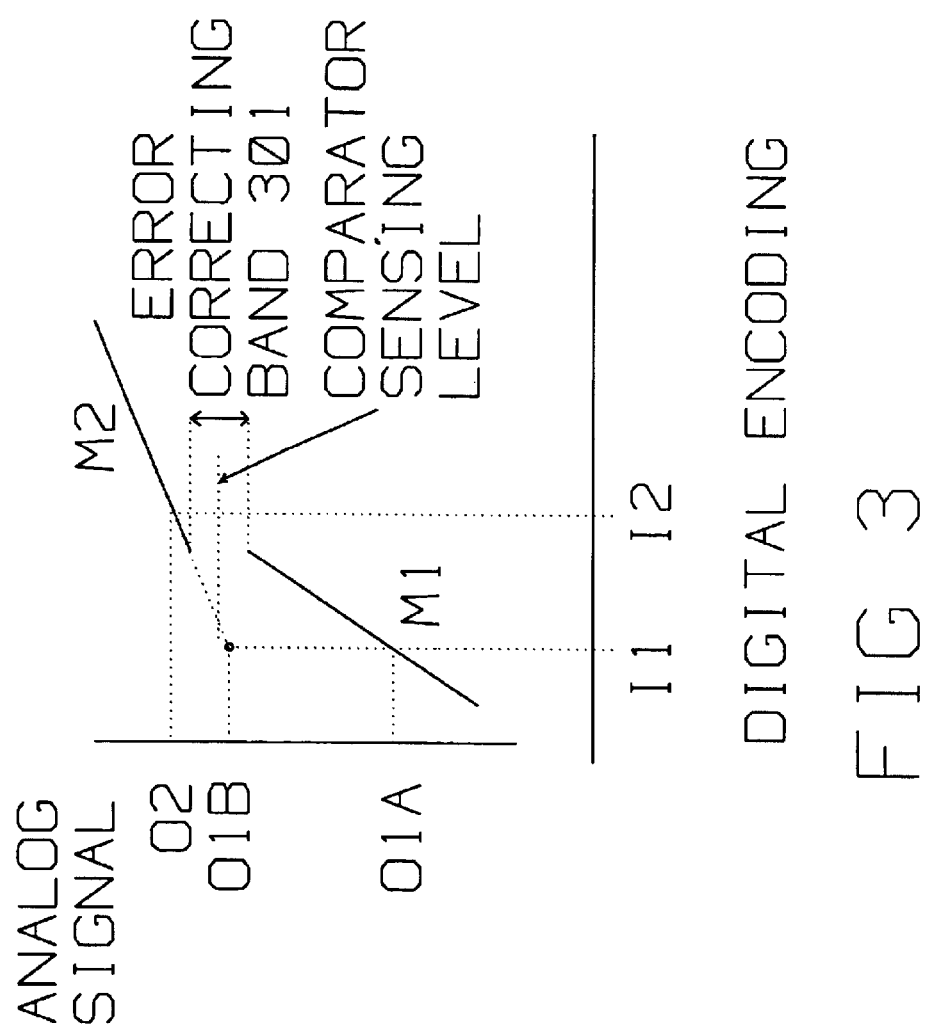
FIG. 3 shows an error correcting band of this invention.

FIG. 3 depicts the piece wise linear transfer function of an analog to digital encoder using the auto-correction mechanism of this invention. An intentional error correcting band is introduced, or encoded, between intervals M1 and M2 of the piece wise linear transfer function comprising M1 and M2. This intentional offset between M1 and M2 enables the auto correction function. The error correcting band will correct for gain and offset errors of comparators forming an A/D or D/A converter, as manifested in the piece wise linear transfer function of the encoder. The offset creates two possible output codes near the comparator switch point level, one corresponding to gain required by the slope of M1 within its operating interval, the other corresponding to the M2 gain.

FIG. 3 depicts a case where I1, unless corrected, can produce two codes, the intended code $O_{1a}$ and/or the error code $O_{1b}$. The intended code $O_{1a}$ can become error code $O_{1b}$ produced if there is a comparator error.

Code $O_{1a}$ corresponds to the comparator making the decision to select the interval defined by gain M1. Conversely, $O_{1b}$ corresponds to the comparator making the decision to select the interval defined by gain M2. Introducing error correcting band 301 precludes making the wrong decision and generating error code $O_{1b}$. With error correcting band 301 in place, intentionally encoded in the analog signal, the comparator within the A/D converter will properly map $O_{1a}$ as well as $O_{1b}$ to $I_1$ and $O_2$ to $I_2$.

Furthermore, error correcting band 301 intentionally introduced to the piece wise linear analog to digital encoder makes it easy to identify the break points between M1 and M2 during digital post processing. That is, the decoder can correctly make the distinction between the gain level M1 or M2, because the comparator switch point information is now encoded as an integral part of the data.

The existence of error correcting band 301 also makes the identification of the offsets and gains of the A/D encoder possible through statistical means. The breaks in the encoded signal, i.e. the lack of certain digital codes corresponding to error correcting band 301 are used to identify the linear intervals M1 and M2. With enough digital samples, the slope and endpoints of each linear section can be computed analytically. The gains (slopes of M1 and M2) and offsets are extracted to reconstruct the multiple linear encoded sections back into a single, error free piece wise linear transfer function. The auto-correction approach of this invention simplifies the recovery of analog data while presented with comparator errors at the cost of a small amount of dynamic range. The small reduction in dynamic range comes from the reduction in $V_{max}$ due to the allocation of some voltage amplitude to correcting band 301.

Figure 4:
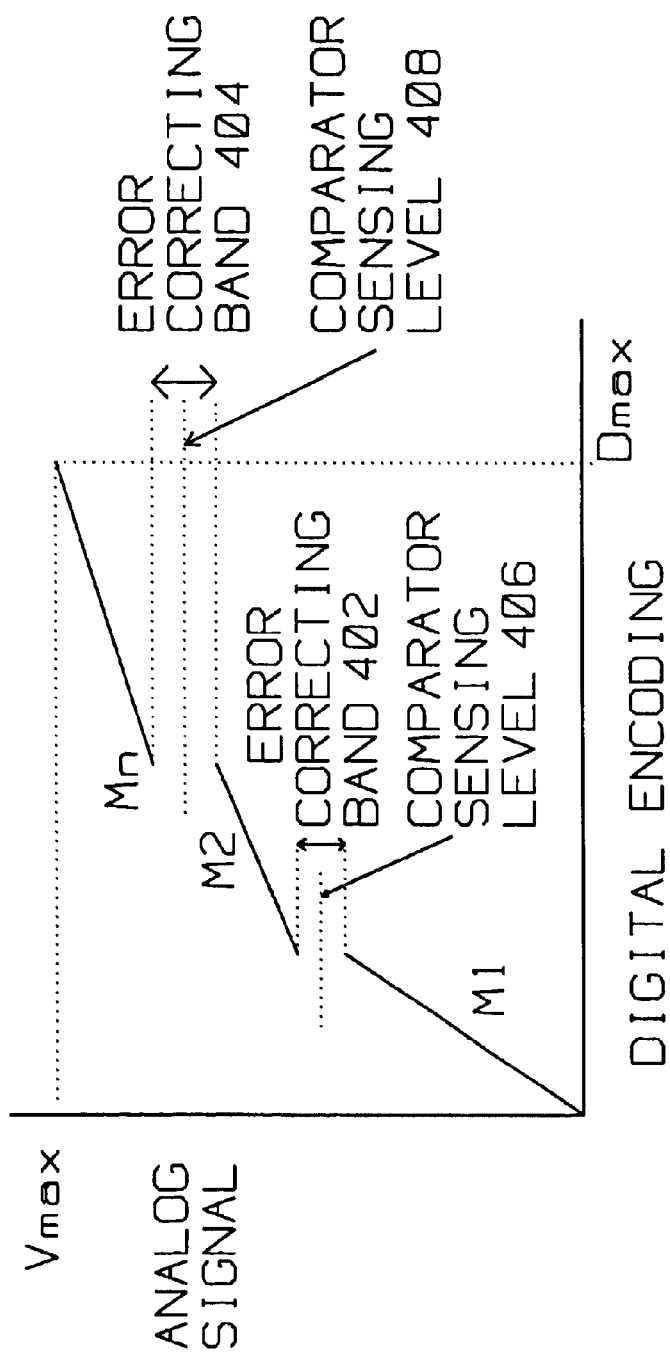
FIG. 4 shows a plurality of error correcting bands encoded in the analog signal for improving the conversion between analog to digital representation.

FIG. 4 uses the same concept to introduce error correcting bands for a plurality intervals M1, M2 to Mn. Maximum voltage $V_{max}$ is divided, for example, into intervals covered by M1, M2 and Mn. Error correcting band 402 is encoded to separate M1 from M2, while Band 404 separates M2 from Mn using the principles shown in FIG. 3. Error correcting band 402 is centered around the nearest theoretical comparator sensing level 406. This reduces comparator errors from incorrectly allocating codes to either M1 or M2. Similarly, Comparator sensing level 408 is centered around the nearest comparator sensing level 404. $V_{max}$ is encoded as $D_{max}$, the largest digital value available.

Figure 5:
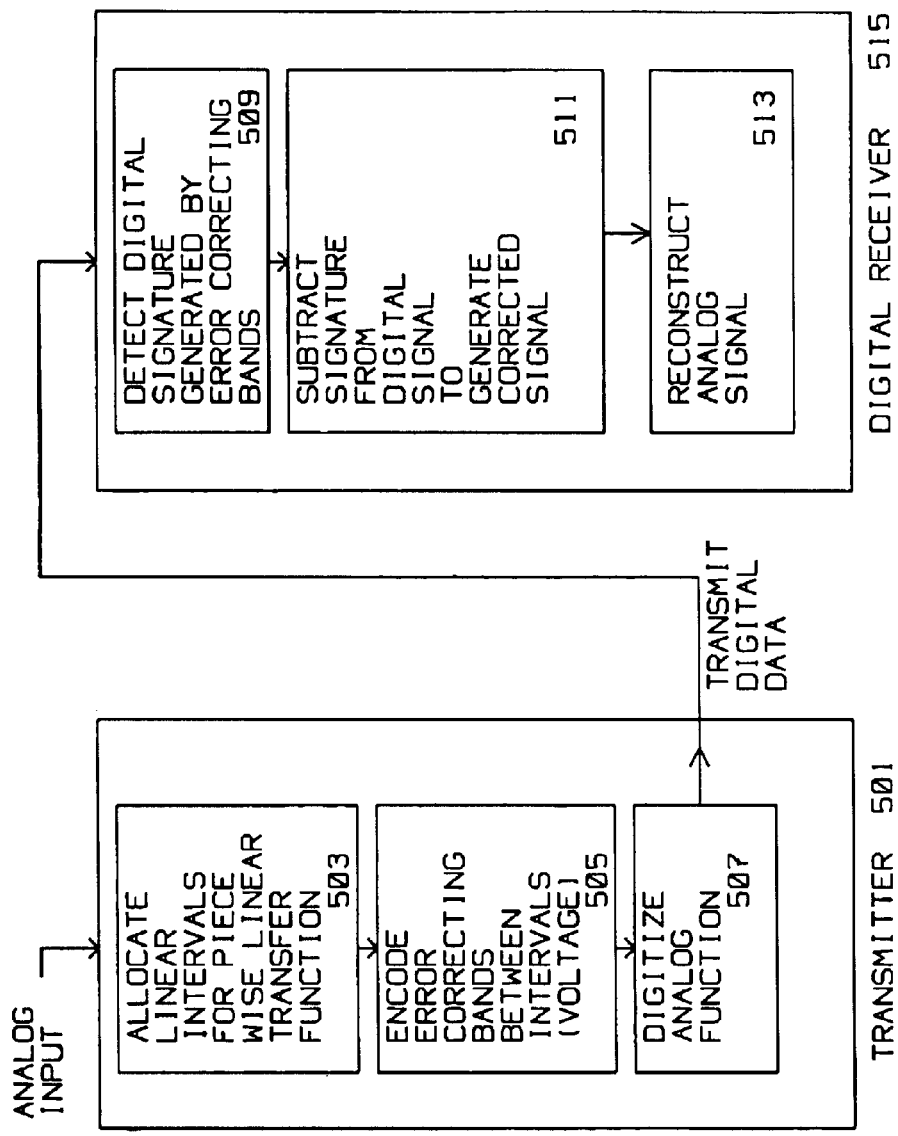
FIG. 5 shows the flow diagram describing the present invention.

FIG. 5 shows a typical flow diagram for the operation of this invention. A digital transmission link for transmitting an analog signal is formed from transmitter 501 and receiver 515. Transmitter 501 uses piece wise linear to digital conversion to convert an analog input (signal) to a digital signal representative of said analog signal. Receiver 515 reconstructs the analog signal from the digital signal generated by transmitter 501.

The analog signal has a minimum voltage and a maximum voltage. The transmitter 501 uses one or more comparators to generate the digital signal. The digital signal has one or more digital bits representative of the analog signal.

Transmitter 501 has two or more voltage intervals for linear analog to digital conversion. Allocate linear intervals for piece wise linear transfer function 503 allocates particular voltage ranges to each interval. The slope of each interval, such as M1 or M2, is chosen to compress the signal or achieve any particular transfer function. Each of the voltage intervals allocated in 503 is concatenated to cover the minimum voltage to maximum voltage range. Encode error correcting bands 505 encodes one or more error correcting bands between each voltage intervals into the analog signal. The analog signal containing the error correcting bands is digitized in Digitize Analog function 507 using standard A/D conversion to obtain a digital signal.

The digital signal is transmitted from transmitter 501 to receiver 515.

Receiver 515 has a detector for a digital signature 509, the digital signature corresponding to the error correcting bands included within the digital signal. The error correcting bands may be detected and removed digitally from the digital word stream in accordance with the known error correcting band allocation encoded into the analog signal, or, extracted from the digital signal itself. The error correcting bands will have a particular signature that can be detected by observing the characteristics of a sequence of, for example, 50 digital conversions transmitted by transmitter 501.

Subtract signature from digital signal 511 subtracts the digital signature from the digital signal transmitted by transmitter 501 to obtain a corrected digital signal.

Reconstruct analog signal 513 converts the corrected digital signal into the original analog signal for use within the receiver.

Typically, each of the comparators used within transmitter 501 to digitize the analog signal has a sensing level. Each error correcting band is centered with respect to one of these comparator sensing levels.

The correcting bands extends over a correcting voltage. This correcting voltage is a fraction of the minimum to maximum voltage. For example, if 12 digital bits are used within the transmitter to convert the analog signal to a digital signal, the error correcting band may be as small as one digital least significant bit, or 1/2048 of the difference between the minimum voltage and maximum voltage.

The error correcting band is typically centered around one of the A/D levels. However, if centering the error correcting band is inconvenient, the invention will also function with the error correcting band offset from the center of one of the A/D levels.

All references cited in this document are incorporated herein in their entirety by reference.

Although presented in exemplary fashion employing specific embodiments, the disclosed structures are not intended to be so limited. For example, while only 3 intervals are shown in FIG. 4, a plurality of error correcting bands can be introduced at certain amplitudes for robust performance or to compensate for A/D limitations. While only piece wise linear functions are illustrated, the invention applies equally where the intervals are not linear, but can also be non-linear.

Those skilled in the art will also appreciate that numerous changes and modifications could be made to the embodiment described herein without departing in any way from the invention. These changes and modifications and all obvious variations of the disclosed embodiment are intended to be embraced by the claims to the limits set by law.

What is claimed is:

1. A method for reducing errors in a piece wise linear analog to digital converter, said piece wise analog to digital converter operating between a minimum voltage and a maximum voltage, said piece wise analog to digital converter using one or more comparators to generate one or more digital bits, each of said digital bits representative of a conversion voltage, said conversion voltage less than said maximum voltage, said method comprising the steps of:

allocating a first voltage interval for linear analog to digital conversion, said first voltage interval extending from said minimum voltage to an intermediate voltage, said intermediate voltage less than said maximum voltage;

allocating a second voltage interval for linear analog to digital conversion, said second voltage interval extending from said intermediate voltage to said maximum voltage;

encoding an error correcting band between said first voltage interval and said second voltage interval.

2. A method as described in claim 1 wherein each of said one or more comparators has a sensing level, said error correcting band centered with respect to one of said sensing level, said sensing level at said intermediate voltage.

3. A method as described in claim 2 wherein said error correcting band extends over a correcting voltage, said correcting voltage a fraction of said conversion voltage.

4. A method as described in claim 3 wherein 12 digital bits are used within said piece wise analog to digital converter.

5. A method as described in claim 4 wherein said error correcting band is 1/2048 of the difference between said minimum voltage and said intermediate voltage.

6. An encoding method for reducing analog to digital conversion errors in a transmitter said transmitter using a piece wise linear to digital conversion to convert an analog signal to a digital signal representative of said analog signal, and a receiver to reconstruct said analog voltage from said digital signal back to said analog format, said analog signal having a minimum voltage and a maximum voltage, said transmitter using one or more comparators to generate said digital signal, said digital signal having one or more digital bits representative of said analog signal, comprising the steps of:

allocating two or more voltage intervals for linear analog to digital conversion within said transmitter, each of said voltage intervals concatenated to cover said minimum voltage to said maximum voltage;

encoding an error correcting band between each of said two or more voltage intervals to obtain a digital signal;

transmitting said digital signal to said receiver;

detecting digital signatures, said digital signatures corresponding to said error correcting bands included within said digital signal;

subtracting said digital signature from said digital signal to obtain a corrected digital signal;

decoding said corrected digital signal to reconstruct said analog signal.

7. A method as described in claim 6 wherein each of said one or more comparators has a sensing level, said error correcting band centered with respect to one of said sensing level.

8. A method as described in claim 7 wherein said error correcting band extends over a correcting voltage, said correcting voltage a fraction of said minimum to said maximum voltage.

9. A method as described in claim 8 wherein 12 digital bits are used within said transmitter to convert said analog signal to said digital signal.

10. A method as described in claim 9 wherein said error correcting band is 1/2048 of the difference between said minimum voltage and said maximum voltage.

11. A piece wise linear analog to digital converter having reduced errors, said piece wise analog to digital converter operating between a minimum voltage and a maximum voltage, said piece wise analog to digital converter using one or more comparators to generate one or more digital bits, each of said digital bits representative of a conversion voltage, said conversion voltage less than said maximum voltage, said converter comprising:

a first voltage interval for linear analog to digital conversion, said first voltage interval extending from said minimum voltage to an intermediate voltage, said intermediate voltage less than said maximum voltage;

a second voltage interval for linear analog to digital conversion, said second voltage interval extending from said intermediate voltage to said maximum voltage;

an error correcting band between said first voltage interval and said second voltage interval.

12. A digital converter as described in claim 11 wherein each of said one or more comparators has a sensing level, said error correcting band centered with respect to one of said sensing level, said sensing level at said intermediate voltage.

13. A digital converter as described in claim 12 wherein said error correcting band extends over a correcting voltage, said correcting voltage a fraction of said conversion voltage.

14. A digital converter as described in claim 13 wherein 12 digital bits are used within said piece wise analog to digital converter.

15. A digital converter as described in claim 14 wherein said error correcting band is 1/2048 of the difference between said minimum voltage and said intermediate voltage.

16. A digital transmission link having a transmitter using a piece wise linear to digital conversion to convert an analog signal to a digital signal representative of said analog signal, and a receiver to reconstruct said analog voltage from said digital signal back to said analog format, said analog signal having a minimum voltage and a maximum voltage, said transmitter using one or more comparators to generate said digital signal, said digital signal having one or more digital bits representative of said analog signal, said digital transmission link comprising:

- a transmitter having two or more voltage intervals for linear analog to digital conversion, each of said voltage intervals concatenated to cover said minimum voltage to said maximum voltage;
- one or more error correcting bands between each of said two or more voltage intervals to obtain a digital signal;
- transmission means for said digital signal to said receiver;
- a receiver having a detector for a digital signature, said digital signature corresponding to said error correcting bands included within said digital signal;
- means for subtracting said digital signature from said digital signal to obtain a corrected digital signal;
- means for converting said corrected digital signal to said analog signal.

17. A link as described in claim 16 wherein each of said one or more comparators has a sensing level, said one or more error correcting band centered with respect to one of said sensing level.

18. A link as described in claim 17 wherein each of said one or more error correcting bands extends over a correcting voltage, said correcting voltage a fraction of said minimum to said maximum voltage.

19. A link as described in claim 18 wherein 12 digital bits are used within said transmitter to convert said analog signal to said digital signal.

20. A method as described in claim 19 wherein said error correcting band is 1/2048 of the difference between said minimum voltage and said maximum voltage.

* * * * *